(12) United States Patent
Lukanc et al.

(10) Patent No.: US 7,313,769 B1
(45) Date of Patent: Dec. 25, 2007

(54) OPTIMIZING AN INTEGRATED CIRCUIT LAYOUT BY TAKING INTO CONSIDERATION LAYOUT INTERACTIONS AS WELL AS EXTRA MANUFACTURABILITY MARGIN

(75) Inventors: Todd P. Lukanc, San Jose, CA (US); Cyrus E. Tabery, Santa Clara, CA (US); Luigi Capodieci, Santa Cruz, CA (US); Carl Babcock, Campbell, CA (US); Hung-Eil Kim, San Jose, CA (US); Christopher A. Spence, Sunnyvale, CA (US); Chris Haidinyak, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 403 days.

(21) Appl. No.: 10/790,381

(22) Filed: Mar. 1, 2004

(51) Int. Cl.
*G06F 17/50* (2006.01)
(52) U.S. Cl. .............................. 716/2; 716/11; 716/21
(58) Field of Classification Search ................... 716/2, 716/21, 4–5, 11
See application file for complete search history.

(56) References Cited

U.S. PATENT DOCUMENTS

| | | | | |
|---|---|---|---|---|
| 5,050,091 A | * | 9/1991 | Rubin | 716/10 |
| 6,415,421 B2 | | 7/2002 | Anderson et al. | 716/4 |
| 6,425,113 B1 | * | 7/2002 | Anderson et al. | 716/5 |
| 6,470,489 B1 | * | 10/2002 | Chang et al. | 716/21 |
| 6,510,730 B1 | | 1/2003 | Phan et al. | 73/105 |
| 6,523,162 B1 | | 2/2003 | Agrawal et al. | 716/19 |
| 6,546,543 B1 | * | 4/2003 | Manabe et al. | 716/21 |
| 6,735,742 B2 | * | 5/2004 | Hatsch et al. | 716/2 |
| 6,845,497 B2 | | 1/2005 | Murai et al. | 716/20 |
| 6,952,818 B2 | * | 10/2005 | Ikeuchi | 716/21 |
| 6,974,650 B2 | * | 12/2005 | Lee et al. | 430/5 |
| 6,978,438 B1 | * | 12/2005 | Capodieci | 716/21 |
| 7,194,725 B1 | * | 3/2007 | Lukanc et al. | 716/19 |
| 2003/0061592 A1 | * | 3/2003 | Agrawal et al. | 716/19 |
| 2003/0177464 A1 | * | 9/2003 | Takechi et al. | 716/10 |
| 2003/0211398 A1 | * | 11/2003 | Lee et al. | 430/5 |
| 2004/0015794 A1 | * | 1/2004 | Kotani et al. | 716/4 |
| 2005/0177811 A1 | * | 8/2005 | Kotani et al. | 716/21 |
| 2005/0188338 A1 | * | 8/2005 | Kroyan et al. | 716/9 |
| 2005/0229125 A1 | * | 10/2005 | Tabery et al. | 716/5 |
| 2006/0005154 A1 | * | 1/2006 | Cobb et al. | 716/5 |

\* cited by examiner

*Primary Examiner*—Jack Chiang
*Assistant Examiner*—Suchin Parihar
(74) *Attorney, Agent, or Firm*—Winstead PC (57) ABSTRACT

A method of producing a layout representation corresponding to an integrated circuit (IC) device design can include generating an initial layout representation in accordance with a predetermined set of design rules and simulating how structures within the initial layout representation will pattern on a wafer. Based on the simulation, portions of the layout representation, which include structures demonstrating poor manufacturability and/or portions of the layout representation in which extra manufacturability margin is present, can be identified. Portions of the layout representation including structures demonstrating poor manufacturability and/or in which extra manufacturability margin is present can be modified to optimize the layout representation.

20 Claims, 5 Drawing Sheets

OPTIMIZING AN INTEGRATED CIRCUIT LAYOUT BY TAKING INTO CONSIDERATION LAYOUT INTERACTIONS AS WELL AS EXTRA MANUFACTURABILITY MARGIN

TECHNICAL FIELD

The present invention relates generally to the field of integrated circuit device design and manufacture and, more particularly, to a system and method for producing an optimized integrated circuit layout representation corresponding to an integrated circuit design.

BACKGROUND

In designing an integrated circuit (IC) device, engineers or designers typically rely on computer design tools to help create an IC schematic or design, which can include a multitude of individual devices, such as transistors, coupled together to perform a certain function. To actually fabricate the IC device in or on a semiconductor substrate, the IC device schematic must be translated into a physical representation or layout, which itself can then be transferred onto the semiconductor substrate surface. Computer aided design (CAD) tools can be used to assist layout designers with translating the discrete circuit elements into shapes, which will embody the devices themselves in the completed IC device. These shapes make up the individual components of the circuit, such as gate electrodes, diffusion regions, metal interconnects and the like.

The software programs employed by the CAD systems to produce layout representations are typically structured to function under a set of predetermined design rules in order to produce a functional circuit. Often, the design rules are determined by certain processing and design limitations based roughly on the patternability of layout designs. For example, design rules may define the space tolerance between devices or interconnect lines.

Once the layout of the circuit has been created, the next step to manufacturing the IC device is to transfer the layout onto a semiconductor substrate. Optical lithography or photolithography is a well-known process for transferring geometric shapes onto the surface of a semiconductor wafer. The photolithography process generally begins with the formation of a photoresist layer on the top surface of a semiconductor substrate or wafer (or some intermediate layer). A reticle or mask having fully light non-transmissive opaque regions, which are often formed of chrome, and fully light transmissive clear regions, which are often formed of quartz, is then positioned over the photoresist coated wafer.

The mask is placed between a radiation or light source producing light of a pre-selected wavelength (e.g., ultraviolet light) and an optical lens system, which may form part of a stepper apparatus. When the light from the light source is directed onto the mask, the light is focused to generate a reduced mask image on the wafer, typically using the optical lens system, which contains one or several lenses, filters, and/or mirrors. This light passes through the clear regions of the mask to expose the underlying photoresist layer, and is blocked by the opaque regions of the mask, leaving that underlying portion of the photoresist layer unexposed. The exposed photoresist layer is then developed, typically through chemical removal of the exposed or non-exposed regions of the photoresist layer. The end result is a semiconductor wafer coated with a photoresist layer exhibiting a desired pattern, which defines the geometries, features, lines and shapes of that layer. This pattern can then be used for etching underlying regions of the wafer.

There is a pervasive trend in the art of IC design and fabrication to increase the density with which various structures are arranged. For example, linewidths and separation between lines are becoming increasingly smaller. With this size reduction, however, various steps within the integrated circuit design and fabrication process become more difficult. For example, as mentioned above, IC device schematics are translated into a layout representation under a set of predetermined design rules. Currently, IC layout design rules are based roughly on the patternability of layout designs, without taking into account many of the layout interactions. This may result in patterns that are "clean" to geometric layout rules, but are very susceptible to bridging or pinching, or patterns that no longer follow desired layer-to-layer expectations due to rounding, end pullback, and/or other interactions not contemplated or otherwise accounted for by the predetermined design rules. In addition, other structures meeting layout design rules can result in less than optimal designs, including excess space or incorrectly sized shapes that might otherwise be packed tighter. Such problems can exist with respect to optimizing a layout for a current process technology as well as expanding into a next generation process technology, thereby jeopardizing critical dimension capabilities.

Accordingly, a need exists in the art for a system and method for producing an optimized integrated circuit layout representation corresponding to an integrated circuit design.

SUMMARY OF THE INVENTION

According to one aspect of the invention, the invention is directed to a method of producing an integrated circuit (IC) layout representation corresponding to an integrated circuit design. The method can include generating an initial layout representation in accordance with a plurality of design rules and simulating how structures within at least a portion of the initial layout representation will pattern on a wafer. Based on the simulation, portions of the layout representation including structures demonstrating poor manufacturability can be identified. In addition, based on the simulation, portions of the layout representation in which extra manufacturability margin is present can be identified. The method can include modifying portions of the layout representation, which include structures demonstrating poor manufacturability, and/or modifying portions of the layout representation in which extra manufacturability margin is present.

According to another aspect of the invention, the invention is directed to a method of optimizing a design rule compliant layout. The method can include defining a manufacturability figure of merit (FOM) and simulating how the layout will pattern on a wafer. The manufacturability of portions of the layout can be evaluated based on the manufacturability FOM. Based on the evaluating step, the design rule compliant layout can be modified.

These and other features of the invention are fully described and particularly pointed out in the claims. The following description and annexed drawings set forth in detail certain illustrative embodiments of the invention, these embodiments being indicative of but a few of the various ways in which the principles of the invention may be employed.

BRIEF DESCRIPTION OF DRAWINGS

These and further features of the present invention will be apparent with reference to the following description and drawings, wherein.

DISCLOSURE OF INVENTION

In the detailed description that follows, corresponding steps have been given reference numerals increasing by increments of one-hundred regardless of whether they are shown in different embodiments of the present invention. To illustrate the present invention in a clear and concise manner, the drawings may not necessarily be to scale and certain features may be shown in somewhat schematic form.

One embodiment of the present invention includes a method of producing or otherwise generating a layout representation corresponding to an integrated circuit (IC) device design using a lithography simulation tool. After an initial layout representation is generated in accordance with a predetermined set of design rules, the simulation tool can be used to simulate how structures within at least a portion of the initial layout representation will pattern on a wafer. The simulation can be used to identify portions of the layout representation, which include structures demonstrating poor manufacturability, as well as portions of the layout representation in which extra manufacturability margin is present. Based upon this information, a layout designer can modify portions of the layout representation including structures demonstrating poor manufacturability as well as portions of the layout representation in which extra manufacturability margins is present in order to optimize the layout and/or design. This methodology allows for layout optimization based on simulation results, without regard for any existing design rules.

The present invention will be described herein in the exemplary context of a design and layout generation process for ultimately patterning a layer of silicon (e.g., polysilicon) that forms a part an IC device. Exemplary IC devices can include general use processors made from thousands or millions of transistors, a flash memory array or any other dedicated circuitry. However, one skilled in the art will appreciate that the methods and systems described herein can also be applied to the design process and/or manufacture of any article manufactured using photolithography, such as micromachines, disk drive heads, gene chips, microelectromechanical systems (MEMS) and so forth.

Figure 1:
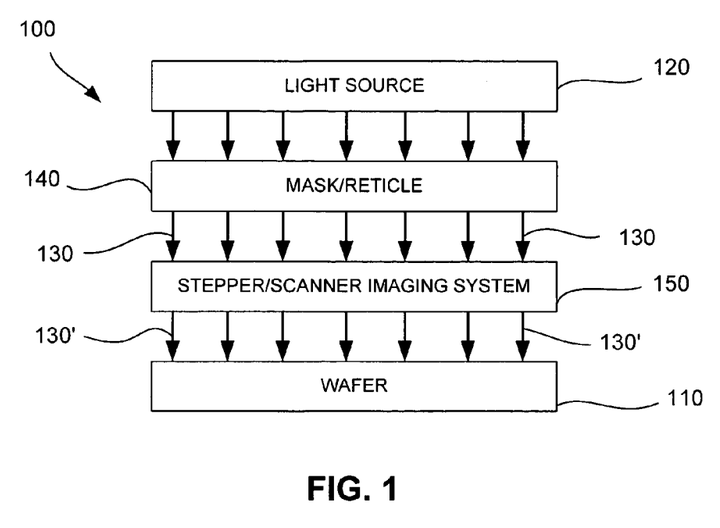
FIG. 1 is a schematic diagram of an exemplary photolithographic processing arrangement.

With reference to FIG. 1, an exemplary photolithographic processing arrangement for manufacturing or otherwise processing integrated circuit (IC) devices designed and layed out in accordance with the present invention is provided. The processing arrangement can include an optical system 100 used to image a pattern onto a wafer 110. The general arrangement of the optical system 100 is relatively well known in the art and will not be described in great detail. The optical system 100 can include a light source 120 for directing light or other actinic energy 130 of a predetermined wavelength toward a mask or reticle 140. The light energy 130 can be, for example, partially coherent light. An exemplary wavelength for the light energy 130 can be about 193 nm, as produced by an argon-fluoride laser. The optical system 100 can be arranged such that the light energy 130 can be used to produce IC nodes on the wafer 110 having a critical dimension (CD) of, for example, 130 nm, 100 nm, 65 nm and so forth. It is also contemplated that other wavelengths, such as 157 nm and extreme-ultraviolet wavelengths, can also be used to produce even smaller CDs, such as 45 nm.

The reticle 140 blocks light energy 130 from certain predetermined portions of the wafer 110 such that a light pattern 130' defined by the reticle layout is transferred to the wafer 110. A stepper/scanner imaging system 150 sequentially directs the light pattern 130' transmitted by the reticle 140 to a series of desired locations on the wafer 110.

Figure 2:
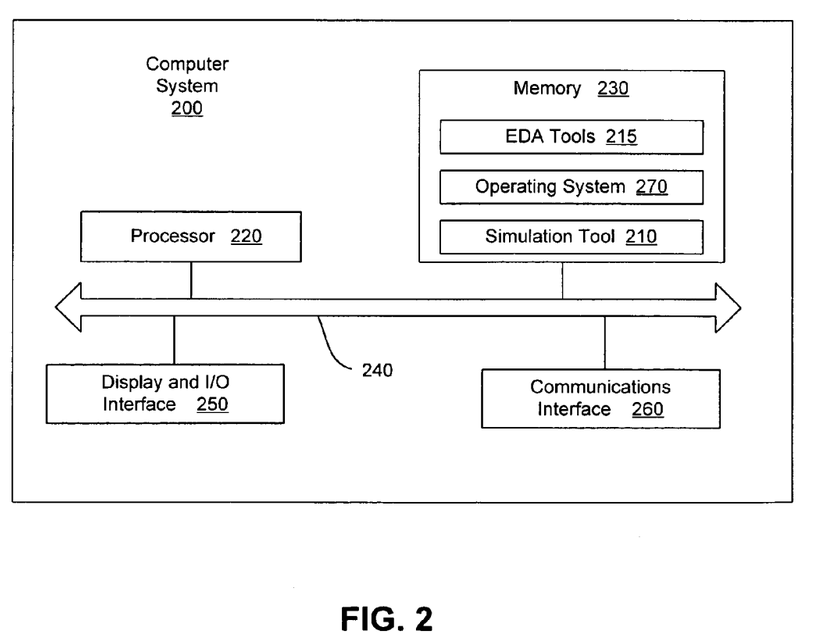
FIG. 2 is a schematic block diagram of a computer system capable of executing a simulation tool in accordance with the present invention.

Turning now to FIG. 2, a schematic block diagram of a computer system 200, which is capable of executing a lithography simulation tool 210 and other design processes using electronic design automation (EDA) tools 215, is illustrated. As indicated, the simulation tool 210 can be used to identify portions of a layout representation including structures exhibiting or otherwise demonstrating poor manufacturability as well as portions of a layout representation in which extra manufacturability margin is present. In one embodiment, the simulation tool 210 is embodied as a computer program (e.g., a software application including a compilation of executable code).

To execute the simulation tool 210, the computer system 200 can include one or more processors 220 used to execute instructions that carry out a specified logic routine. In addition, the computer system 200 can include a memory 230 for storing data, software, logic routine instructions, computer programs, files, operating system instructions, and the like. The memory 230 can comprise several devices and includes, for example, volatile and non-volatile memory components. As used herein, the memory 230 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 220 and the memory 230 are coupled using a local interface 240. The local interface 240 can be, for example, a data bus, accompanying control bus, a network, or other subsystem.

The computer system 200 can include various video and input/output interfaces 250 as well as one or more communications interfaces 260. The interfaces 250 can be used to couple the computer system 200 to various peripherals and networked devices, such as a display (e.g., a CRT display or LCD display), a keyboard, a mouse, a microphone, a camera, a scanner, a printer, a speaker, and so forth. The communications interfaces 260 can be comprised of, for example, a modem and/or network interface card, and can enable the computer system 200 to send and receive data signals, voice signals, video signals, and the like via an external network, such as the Internet, a wide area network (WAN), a local area network (LAN), direct data link, or similar wired or wireless system.

The memory 230 can store an operating system 270 that is executed by the processor 220 to control the allocation and usage of resources in the computer system 200. Specifically, the operating system 270 controls the allocation and usage of the memory 230, the processing time of a processor 220 dedicated to various applications being executed by the processor 220, and the peripheral devices, as well as performing other functionality. In this manner, the operating system 270 serves as the foundation on which applications, such as the simulation tool 210, depend, as is generally known by those of ordinary skill in the art.

Figure 3:
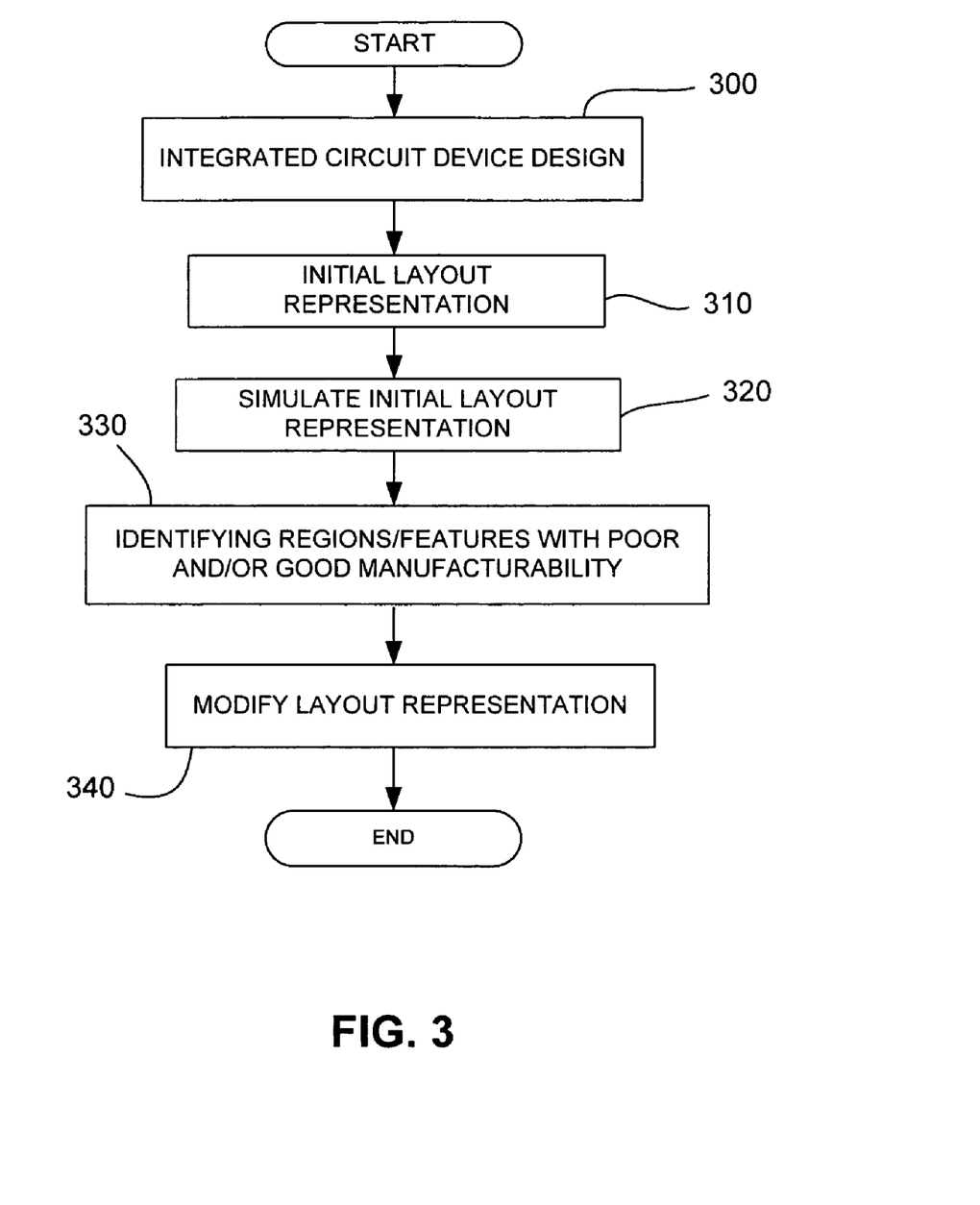
FIG. 3 is a flow chart illustrating a method of producing a layout representation corresponding to an integrated circuit (IC) device design in accordance with one embodiment of the present invention.

With reference now to FIG. 3, one embodiment of a method for producing a layout representation corresponding to an integrated circuit (IC) device design is provided. The flow chart of FIG. 3 can be thought of as depicting steps of a method implemented on or with the assistance of the computer system 200 of FIG. 2.

The method can begin at step 300 where an integrated circuit device design or schematic is provided by an engineer or designer. Alternatively, the IC device design can be received from an outside source for processing in a manner described herein. It is to be appreciated that, in one embodiment, exemplary IC devices can include general use processors made from thousands or millions of transistors, a flash memory array, SRAM (static random-access memory) cells or any other dedicated circuitry. The designer can provide or otherwise design an IC device having a desired set of performance specifications and/or electrical characteristics. The IC device design can be embodied in a high-level description, commonly referred to as a "netlist." The netlist can be described in languages, such as VHDL and Verilog®, for example.

At step 310, the IC device design can be converted or otherwise translated into an initial physical representation or layout representation (also referred to simply as a layout). The layout can define the specific dimensions of the gates, isolation regions, interconnects, contacts, and other device elements that form the physical structures within the device design. These can be represented by a variety of shapes, polygonal, curvilinear and the like.

In one embodiment, the initial layout representation can be generated or otherwise produced in accordance with a predetermined set of design rules. It is to be appreciated that the design rules can be determined by certain processing and/or design limitations, based roughly on the patternability of layout designs. For example, the design rules can define the space tolerance between adjacent structures or devices, interconnect lines and the like. In addition, the design rules can include constraints on layer-to-layer relationships between, for example, active, metal and polysilicon layers.

The layout representation can be embodied in a layout data file or data set (also referred to as a target database). The layout data file can include data layers that correspond to the actual layers to be fabricated in the IC device. The layout data file can also include cells, which define sets of particular devices within the circuit or IC device design. A cell can include all of the shapes on all of the layers required for the fabrication of the devices it contains. It is to be appreciated that cells can be nested or otherwise contained within other cells, often in very intricate arrangements. The structure of cells is commonly referred to as a data hierarchy. Typical formats for the shapes of a layout data file or target database are GDS II or CIF.

At step 320, the initial layout representation, generated or otherwise provided at step 310, can be simulated. Simulating the initial layout representation can include producing or otherwise generating a simulation image, which corresponds to a simulation of an image that would be printed on a wafer if the wafer was exposed to an illumination source directed through a mask including the initial layout representation. Alternatively, the simulation image can correspond to a simulation of a photoresist layer that would be patterned according to exposure to an illumination source directed through a mask including the initial layout representation. As such, the real pattern of structures within the initial layout representation can be simulated as a result of one or more of resolution enhancement technologies (RET), optical proximity corrections (OPC), proximity to other structures, density, corner rounding, as well as any other parameters that can alter the final image (i.e., the wafer image) as compared to the drawn layout. In addition, the wafer image can also be evaluated with respect to exposure and/or focus variations or other process variations that may alter or otherwise shift the edge placement of structures within the layout with respect to the "target image."

The layout can be simulated using one of a variety of commercially available simulation tools, such as, for example, CALIBRE® from Mentor Graphics Corp. Such simulation tools are useful for simulating or otherwise predicting how structures within the layout representation, corresponding to the device design, will actually pattern and/or what manufacturing defects may occur during lithographic processing.

At step 330, the simulated layout (step 320) can be examined in order to identify areas, regions and/or features (e.g., structure edges), which demonstrate or are otherwise indicative of poor or unacceptable manufacturability. In addition, the simulated layout can be examined in order to identify areas, regions and/or features, which demonstrate or are otherwise indicative of good or acceptable manufacturability (e.g., having extra manufacturability margin). In one embodiment, all structure edges within the simulated initial layout representation can be classified or otherwise evaluated based on manufacturability.

As is discussed more fully below, the areas, regions and/or features of the simulated layout demonstrating poor and/or good manufacturability can be determined and/or identified by applying one or more optical rule checking (ORC) checks. The ORC checks can be performed based on one or more process-related parameters, also referred to as metrics. Pattern or structure edges that fall outside of an allowed range of one or more process-related parameters may be identified as demonstrating poor or unacceptable manufacturability. In one embodiment, areas, regions and/or features of the simulated layout, which demonstrate poor and/or good manufacturability, can be determined and/or identified based on a manufacturability figure of merit (FOM). As is discussed more fully below, the manufacturability FOM can be made up of (or otherwise based on) one or more process-related metrics.

Once regions and/or features of the simulated layout demonstrating poor and/or good manufacturability are identified (step 330), the layout can be modified (step 340) in order to optimize the layout without having a negative impact on manufacturability. As is discussed more fully below, modifications to the layout (step 340) can include compacting or otherwise moving structures closer together in regions identified as demonstrating good manufacturability or the presence of extra manufacturability margin. Conversely, portions of the layout identified as exhibiting poor manufacturability can be modified to provide greater manufacturability margin (e.g., more space can be provided between structures and/or the linewidths of structures can be decreased). It is to be appreciated that modifications to the layout (step 340) can be performed without regard for and/or in violation of the predetermined set of design rules. In other words, the method illustrated in FIG. 3 allows for layout optimization based on simulation results, without regard for any existing design rules. It is to be appreciated that the method illustrated in FIG. 3 could be structured as an iterative loop performed for a set number of iterations or until a desired result is accomplished.

Figure 4:
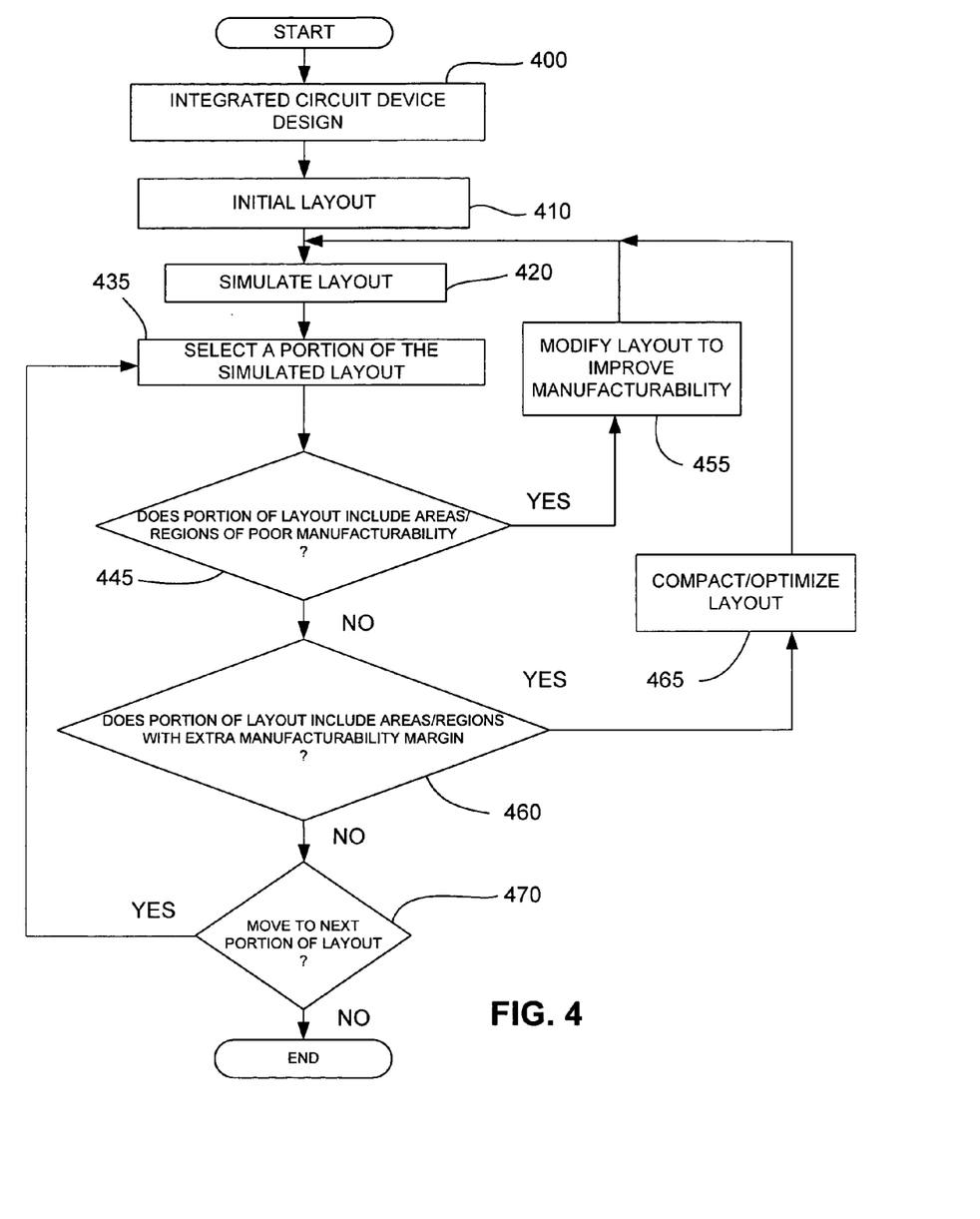
FIG. 4 is a flow chart illustrating a method of producing a layout representation corresponding to an IC device design in accordance with another embodiment of the present invention.

With reference now to FIG. 4 and continued reference to FIG. 3, a more detailed flow chart illustrating one embodiment of a method for producing a layout representation corresponding to an IC device design is provided. As discussed above with reference to FIG. 3, the flowchart of FIG. 4 can be thought of as depicting steps of a method implemented on or with the assistance of the computer system 200 of FIG. 2.

At step 400, an IC device design or schematic can be provided. As discussed above, the IC device design can be embodied in a high-level netlist description.

At step 410, the IC device design can be converted or otherwise translated into an initial layout of various shapes representing physical structures corresponding to the device design. The initial layout can be generated or otherwise produced according to or in conformity with a predetermined set of design rules.

At step 420, the initial layout can be simulated. As discussed above, simulating the initial layout can include producing or otherwise generating a simulation image, which corresponds to a simulation of an image that would be printed on a wafer if the wafer was exposed to an illumination source directed through a mask including the initial layout. Alternatively, the simulation image can correspond to a simulation of a photoresist layer that would be patterned according to exposure to an illumination source directed through a mask including the initial layout. The layout can be simulated using one of a variety of commercially available simulation tools, such as, for example, CALIBER® from Mentor Graphics Corp. In one embodiment, generating the simulation image can include generating one or more intensity contours. It is to be appreciated that multiple contours, intensity or otherwise, can be generated and used in conjunction with ORC in order to check process-related parameters or metrics, other than just image intensity, such as, for example, the slope of the intensity at edges and/or logarithm of the slope of the intensity at edges.

Once the initial layout has been simulated (step 420), a portion of the simulated layout (also referred to as a window) can be selected (step 435). At step 445, the selected portion of the simulated layout can be examined to determine whether it includes areas, regions and/or features (e.g., structure edges), which demonstrate or are otherwise indicative of poor manufacturability. In one embodiment, all structure edges within the selection portion of the simulated layout can be evaluated or otherwise classified based on manufacturability. Regions, features or edges, which demonstrate or exhibit poor manufacturability can be determined by applying one or more ORC checks. ORC can be performed based on one or more process-related parameters or metrics. These process-related metrics can be indicative of the manufacturability of a layout or a portion thereof.

In one embodiment, ORC can be performed based on, but not limited to, one or more aerial image metrics, such as contrast, image log slope, image slope (i.e., intensity slope at edges), minimum intensity, maximum intensity and/or intensity at a distance (e.g., 0-1000 nm). Alternatively, simulators can also simulate final resist or etched images and base manufacturability on at least one of resist height, sidewall angle, and edge placement. Latent image metrics may also be employed, such as photo active compound (PAC) or photoacid (PA) gradient, maximum PAC concentration, and minimum PAC concentration. In addition, post exposure bake metrics of image transfer quality may also be used, including, deprotected sites, such as gradients or minimum/maximum values or values at edge.

Figure 5:
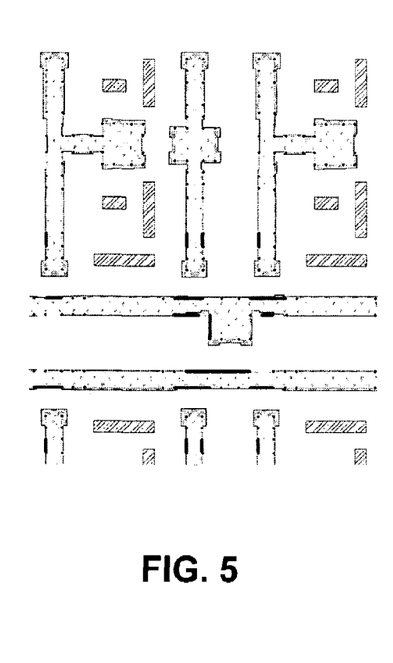
FIG. 5 is a portion of an exemplary layout representation.
Figure 6:
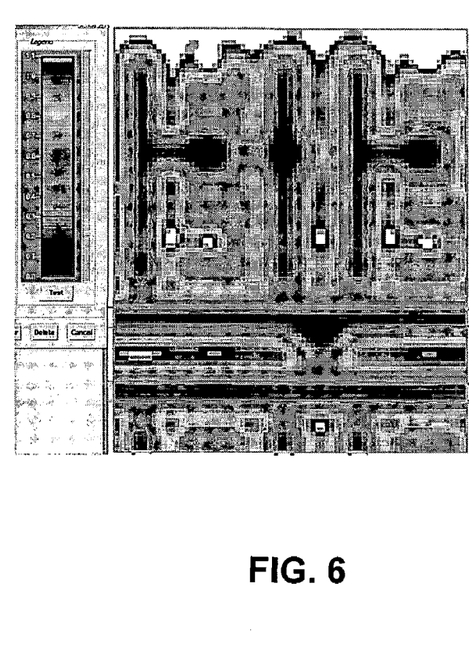
FIG. 6 is a simulation image which corresponds to the layout representation of FIG. 5.
Figure 7:
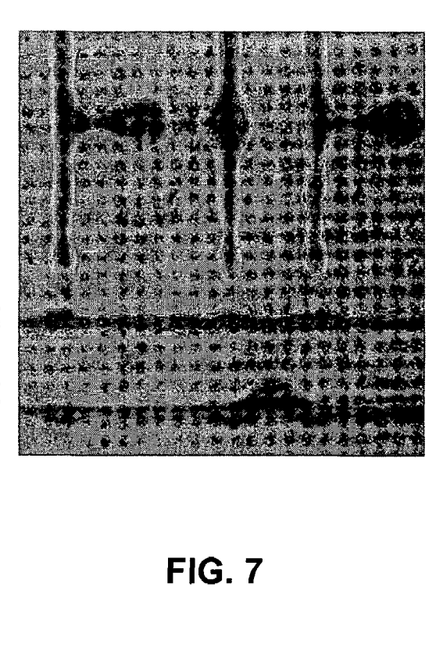
FIG. 7 is a scanning electron microscope (SEM) image of a patterned wafer which corresponds to the images illustrated in FIGS. 5 and 6.

In one embodiment, regions, features or edges, which demonstrate or exhibit poor manufacturability can be determined or identified based on a manufacturability FOM. In one embodiment, the manufacturability FOM can be made up of or otherwise based on one or more of the above-identified aerial image metrics. Developing, defining or otherwise creating a manufacturability FOM can include examining or otherwise studying several aspects of a layout. For example, FIGS. 5, 6 and 7 illustrate a drawn layout, a corresponding simulation image, and a corresponding scanning electron microscope (SEM) image (also known as a wafer image) for an exemplary layout portion. By studying the wafer image (FIG. 7), it can be understood where problems exist (e.g., bridging between adjacent structures, pinching of a structure, corner rounding, end pullback and other layout interactions). Once these problem areas are identified on the wafer image, the corresponding areas/portions of the simulation image can be examined to determine appropriate values for one or more of the above-identified aerial image metrics (or other appropriate metrics). One or more of these process-related metrics can then be selected to serve individually or in combination as the manufacturability FOM and can be employed during optical rule checking.

For example, for a given layout or portion thereof, the aerial image metrics of minimum intensity, maximum intensity and edge intensity slope can be selected to serve as or otherwise provide a manufacturability FOM for evaluating layout patterns. Once the above-identified metrics are selected, a wafer image (e.g., FIG. 7) and a corresponding simulation image (e.g., FIG. 6) can be examined (e.g., at several focus values) to determine values for each metric to be used during ORC checks. For example, it may be determined that for a polysilicon layer, poor or problematic manufacturability may exist if the logarithm of the slope of the intensity at edges is less than about 19. Further, it may be determined that problematic manufacturability may exist if the minimum intensity of the layout or portion thereof is greater than about 0.2. Further, in this exemplary embodiment, it may be determined that poor or problematic manufacturability may exist if the maximum intensity of the layout or portions thereof is less than about 0.5. Setting values or guidelines for one or more metrics can be thought of as creating patterning or manufacturability issue definitions. It is to be appreciated that different manufacturability FOMs or patterning issue definitions can be created for different regions of a layout or different features within a layout. For example, the above-identified exemplary threshold values for log of intensity slope, minimum intensity, and maximum intensity may be different for layers other than the polysilicon layer (e.g., active layers and metal) as well as different regions (e.g., the end cap or the end of a line).

If it is determined that the selected portion of the layout does contain regions, features or edges demonstrating poor manufacturability (step 445), the layout can be modified at step 455 in order to improve manufacturability. In one embodiment, layout modifications to improve manufacturability can include, but are not limited to, increasing or decreasing space between adjacent structures, increasing or decreasing the line width of structures, providing more space adjacent inside corners, making edges wider, adjusting the aspect ratio (i.e., length vs. width ratio) of a structure, adjusting the area of a structure (e.g., a polygon or a contact hole), and the like. It is to be appreciated that these modifications can be performed without regard for and/or in violation of any existing or predetermined design rules.

Once it is determined that the selected layout portion does not include any regions, features or edges, which demonstrate or exhibit poor manufacturability, the selected layout portion can be examined to determine whether it includes areas, regions or features, which demonstrate or are otherwise indicative of good or acceptable manufacturability or extra manufacturability margin (step 460). It is to be appreciated that extra manufacturability margin can include areas, regions or features in which edges are not heavily dependent on process-related variation (i.e., edges are relatively stable). In addition, areas, regions or features in which extra manufacturability margin exist can include those areas, regions or features in which the layout can be further compacted or otherwise optimized.

In one embodiment, regions, features or edges which demonstrate or are otherwise indicative of extra manufacturability margin can be determined or identified in a manner similar to that described above with respect to identifying poor manufacturability. ORC can be performed based on one or more of the aforementioned aerial image metrics, latent image metrics and/or post exposure bake metrics and regions, features or edges demonstrating extra manufacturability margin can be identified based on a manufacturability FOM. For example, if minimum intensity is used as a metric, regions, features or edges where the minimum intensity goes below about five percent of the normalized full intensity can be identified as demonstrating extra manufacturability margin, thereby indicating that room exists to reduce the spacing between two structures without having an adverse effect on manufacturability.

It is to be appreciated that identifying regions, features or edges, which demonstrate poor manufacturability and/or extra manufacturability margin, can include evaluating the simulated layout with respect to any or all of the aforementioned metrics over a range of focus and intensity (i.e., over a process window) to determine whether an undesired effect begins to occur as the focus and intensity move away from the "best settings." In addition, one or more metrics can be evaluated over the process window at one or more other locations on the wafer.

If it is determined that portions of the layout include extra manufacturability margin, the layout or portions thereof can be compacted or otherwise optimized at step 465. Compaction or optimization of the layout can include, but is not limited to, pushing outer corners closer together, moving contacts to inner corners of metal lines, moving contacts closer to poly end caps, reshaping active and metal layers to maintain width and space, adding side extensions to poly end caps to improve overlap and the like. As discussed above, this layout optimization can be performed based on simulation results, without regard for and/or in violation of any existing design rules. Critical cell layout can be "packed" with respect to the wafer image with a minimum cell area possible without creating manufacturing limitations (and/or improving overall manufacturability).

Once it is determined that the selected layout portion does not include areas, regions or features having extra manufacturability margin, the next portion of the layout or window can be selected at step 470 and the methodology described above can be repeated, as appropriate. It is to be appreciated that the method illustrated in FIG. 4 can be structured as an iterative loop performed for a set number of iterations or until a desired result is accomplished.

Figure 8:
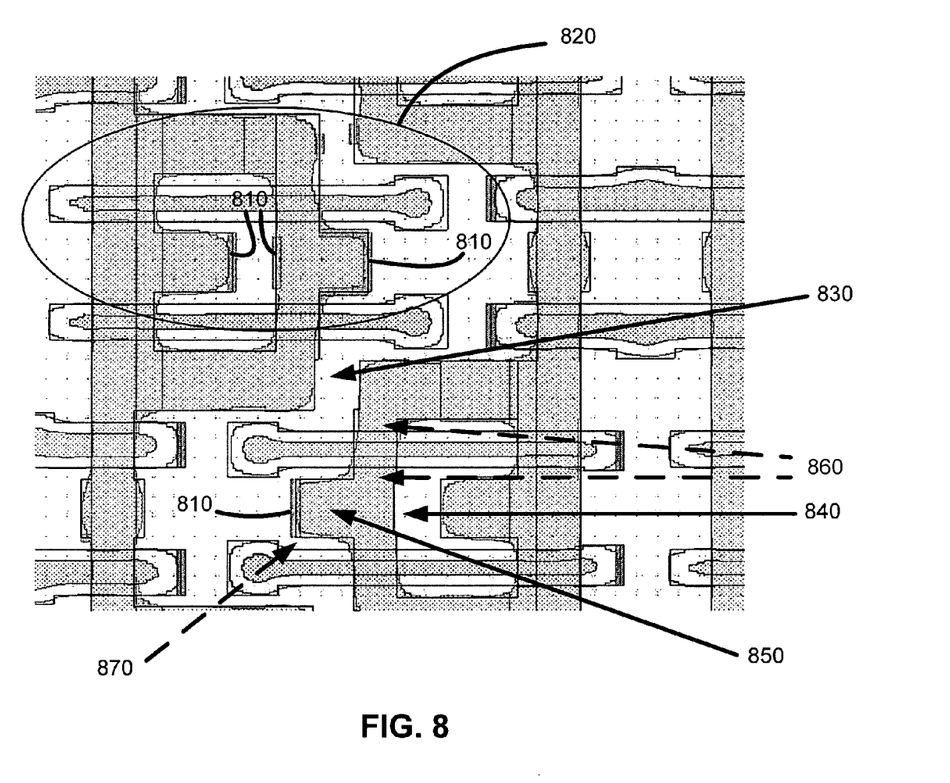
FIG. 8 is a top view of a portion of an exemplary simulated layout representation in which regions demonstrating poor manufacturability are identified.

In one embodiment, steps 445 and/or 460 in which areas, regions or features of the layout, which demonstrate poor and/or good manufacturability, are identified can include generating or otherwise providing graphical representations of the layout or portion thereof. FIG. 8 provides an exemplary graphical representation of a layout portion. In accordance with step 445, pattern or structure edges that fall outside of the allowed ranges set by the manufacturability FOM or the other metrics (e.g., pattern or structures that fail one or more ORC checks) can be flagged as being problematic. Conversely, edges or regions demonstrating extra manufacturability margin can also be flagged or otherwise identified.

For example, FIG. 8 illustrates edges or regions 810 that have been flagged as being problematic from a manufacturability point of view. The portion of the layout designated as 820 is representative of an exemplary layout portion before any corrections and/or modifications. In response to at least one of steps 445 and 460, the portion of the layout designated as 830 is representative of an active correction in which 0.3×2.6 lambda has been cut out of both corners. Further, the portion of the layout indicated by 840 is representative of a correction in which 0.15×3 lambda is cut from the line. The portion of the layout indicated by 850 is representative of a correction in which the "finger" is extended by 0.5 lambda.

In addition, FIG. 8 illustrates examples of how the layout can be modified or otherwise optimized based on simulation results without regard for and/or in violation of any existing design rules. For example, the portion of the layout indicated by 860 is representative of a layout modification made in violation of the design rules, by having an internal portion that is too narrow (according to the predetermined design rules). In addition, the portion of the layout indicated by 870 is representative of a layout modification of an area, which results in the active to poly spacing being in violation of the design rules. Despite these violations of the existing design rules, the methodology described herein is capable of providing layouts having smaller final areas with tighter packing with no negative impact on manufacturability. In addition, the true shape and electrical characteristics can be determined and optimized. This can result in smaller more predictable cells and smaller die with higher yields, less cost, more predictable characteristics, and more value to the die. For example, in accordance with one example, the methodology described above can provide a 15% reduction in an SRAM cell without adversely affecting manufacturability.

It is to be appreciated that the methodology described herein can be applied to optimize layouts for a current technology as well as to perform a forward-looking prediction or optimization of a library of designs for a next-generation technology.

Although the illustrations appended hereto show a specific order of executing functional logic blocks, the order of execution of the blocks can be changed relative to the order shown. Also, two or more blocks shown in succession can be executed concurrently or with partial concurrence. Certain blocks may also be omitted. In addition, any number of commands, state variables, warning semaphores, or messages can be added to the logical flow for purposes of enhanced utility, accounting, performance, measurement, or for providing troubleshooting aids, and the like. It is understood that all such variations are within the scope of the present invention.

Although particular embodiments of the invention have been described in detail, it is understood that the invention is not limited correspondingly in scope, but includes all changes, modifications and equivalents.

What is claimed is:

1. A method of producing an integrated circuit (IC) device layout representation corresponding to an IC device design, said method comprising:
   (a) generating an initial layout representation in accordance with a plurality of design rules;
   (b) simulating how structures within at least a portion of the initial layout representation will pattern on a wafer;
   (c) based on the simulating step, identifying portions of the layout representation which include structures demonstrating poor manufacturability;
   (d) based on the simulating step, identifying portions of the layout representation in which extra manufacturability margin is present; and
   (e) modifying at least one of (i) portions of the layout representation which include structures demonstrating poor manufacturability and (ii) portions of the layout representation in which extra manufacturability margin is present;
   wherein for portions of the layout representation including structures demonstrating poor manufacturability, step (e) includes:
      at least one of (i) providing more space between adjacent structures, (ii) decreasing linewidth of one or more structures, and (iii) making edges of one or more structures wider.

2. The method of claim 1, said method further comprising:
   (f) simulating how structures within at least a portion of the modified layout representation will pattern on a wafer; and
   (g) repeating steps (c)-(f) until no portions of the layout representation demonstrate poor manufacturability.

3. The method of claim 1, said method further comprising:
   performing at least one optical proximity correction (OPC) on the initial layout representation before step (b).

4. The method of claim 1, wherein step (c) includes:
   performing optical rule checking (ORC) on the simulated layout representation.

5. The method of claim 4, wherein performing ORC includes checking at least one of aerial image metrics, resist image metrics and post exposure bake metrics.

6. The method of claim 5, wherein ORC is performed on one or more portions of the simulated layout representation over a process window of focus and intensity.

7. The method of claim 5, wherein the aerial image metrics include at least one of image edge slope, image edge log slope, contrast, minimum intensity, maximum intensity, edge placement error and intensity at a given distance.

8. The method of claim 1, wherein step (c) includes:
   defining a manufacturability figure of merit (FOM); and
   evaluating the manufacturability of at least a portion of the simulated layout representation based on the manufacturability FOM.

9. The method of claim 8, wherein defining a manufacturability FOM includes:
   identifying one or more metrics which are indicative of a manufacturable layout representation; and
   selecting acceptable ranges for the one or more metrics.

10. The method of claim 9, wherein the evaluating step includes:
    performing optical rule checking (ORC) on the simulated layout representation using the selected acceptable ranges for the one or more metrics.

11. The method of claim 10, wherein the one or more metrics include at least one of image edge slope, image edge log slope, contrast, minimum intensity, maximum intensity, edge placement error and intensity at a given distance.

12. A method of producing an integrated circuit (IC) device layout representation corresponding to an IC device design, said method comprising:
    (a) generating an initial layout representation in accordance with a plurality of design rules;
    (b) simulating how structures within at least a portion of the initial layout representation will pattern on a wafer;
    (c) based on the simulating step, identifying portions of the layout representation which include structures demonstrating poor manufacturability;
    (d) based on the simulating step, identifying portions of the layout representation in which extra manufacturability margin is present; and
    (e) modifying at least one of (i) portions of the layout representation which include structures demonstrating poor manufacturability and (ii) portions of the layout representation in which extra manufacturability margin is present;
    wherein step (c) includes:
       defining a manufacturability figure of merit (FOM); and
       evaluating the manufacturability of at least a portion of the simulated layout representation based on the manufacturability FOM;
    wherein defining a manufacturability FOM includes:
       identifying one or more metrics which are indicative of a manufacturable layout representation;
       selecting acceptable ranges for the one or more metrics;
       selecting an exemplary layout;
       generating a simulation image corresponding to how the selected exemplary layout pattern will pattern on a wafer;
       evaluating a scanning electron microscope (SEM) image of the selected exemplary layout portion printed on a wafer;
       identifying areas on the SEM image that are problematic with respect to manufacturability; and
       for each problematic area on the SEM image, locating the corresponding portion of the simulation image and determining acceptable ranges for the one or more metrics based on the simulation image.

13. The method of claim 1, wherein step (c) includes:
    identifying metrics which are indicative of a manufacturable layout representation.

14. The method of claim 1, wherein for portions of the layout representation in which extra manufacturability margin is present, step (e) includes:
    compacting at least a portion of the layout representation.

15. A method of producing an integrated circuit (IC) device layout representation corresponding to an IC device design, said method comprising:
    (a) generating an initial layout representation in accordance with a plurality of design rules;

(b) simulating how structures within at least a portion of the initial layout representation will pattern on a wafer;

(c) based on the simulating step, identifying portions of the layout representation which include structures demonstrating poor manufacturability (d) based on the simulating step, identifying portions of the layout representation in which extra manufacturability margin is present; and (e) modifying at least one of (i) portions of the layout representation which include structures demonstrating poor manufacturability and (ii) portions of the layout representation in which extra manufacturability margin is present;

wherein for portions of the layout representation in which extra manufacturability margin is present, step (e) includes:

at least one of (i) moving outer corners of structures closer to adjacent structures, (ii) moving contacts closer to inner corners of metal lines, (iii) moving contacts closer to polysilicon end caps, (iv) reshaping active or metal layers to maintain width and space, and (v) adding side extensions to polysilicon end caps.

16. The method of claim 1, wherein step (b) includes simulating how structures will pattern on a wafer as a result of at least one of resolution enhancement technologies (RET), optical proximity correction (OPC), proximity to other structures, density of structures and corner rounding.

17. The method of claim 1, wherein step (e) includes violating at least one of the plurality of design rules.

18. The method of claim 1, wherein step (e) is performed despite there existing no violation of any of the plurality of design rules.

19. The method of claim 1, wherein step (c) includes providing a graphical representation indicating structures demonstrating poor manufacturability.

20. The method of claim 19, wherein step (d) includes providing a graphical representation identifying portions of the layout representation in which extra manufacturability margin is present.

* * * * *